(12) United States Patent
Seong et al.

(10) Patent No.: US 6,525,527 B1
(45) Date of Patent: Feb. 25, 2003

(54) COOLING SYSTEM FOR A MODULE IC HANDLER

(75) Inventors: Eun Hyoung Seong, Seoul (KR); Tae Sung An, Kyoungki-do (KR); Chan Ho Park, Choongchungnam-do (KR)

(73) Assignee: Mirae Corporation, Choongchungnam-do (KR)

( * ) Notice: Subject to any disclaimer, the term of this patent is extended or adjusted under 35 U.S.C. 154(b) by 0 days.

(21) Appl. No.: 09/713,028

(22) Filed: Nov. 16, 2000

(30) Foreign Application Priority Data

Nov. 19, 1999 (KR) .............................. 99-51558

(51) Int. Cl.⁷ .............................................. G01R 1/04
(52) U.S. Cl. ................................ 324/158.1; 361/698
(58) Field of Search ...................... 324/158.1; 165/80.3, 165/80.4, 908; 257/714, 722; 361/698, 699, 702, 704, 691, 692, 693, 694

(56) References Cited

U.S. PATENT DOCUMENTS

| | | | |
|---|---|---|---|
| 4,604,572 A | 8/1986 | Horiuchi et al. | 324/158 |
| 4,982,153 A | 1/1991 | Collins et al. | 324/158 |
| 5,083,194 A * | 1/1992 | Bartilson | 357/81 |
| 5,084,671 A | 1/1992 | Miyata et al. | 324/158 |
| 5,504,651 A * | 4/1996 | Atarashi et al. | 361/700 |
| 5,742,158 A | 4/1998 | Itoh | 324/158.1 |
| 5,742,168 A | 4/1998 | Kiyokawa et al. | 324/754 |
| 5,842,352 A * | 12/1998 | Gregory | 62/151 |
| 5,991,163 A * | 11/1999 | Marconi et al. | 361/788 |
| 6,091,062 A | 7/2000 | Pfahnl et al. | 219/497 |
| 6,209,626 B1 * | 4/2001 | Bhatia | 165/104.25 |
| 6,324,042 B1 * | 11/2001 | Andrews | 361/93.2 |

* cited by examiner

*Primary Examiner*—Christine Oda
*Assistant Examiner*—Etienne LeRoux
(74) *Attorney, Agent, or Firm*—Fleshner & Kim, LLP

(57) ABSTRACT

A cooling system for a module IC handler is provided. The cooling system includes an air jet for cooling heat generated from the module IC where the IC is tested. The cooling system includes a base plate, an air jet body mounted on the base plate and having one or more coupling portions, a plurality of plates provided at one side of the air jet body, and a cover provided at the other side of the air jet body. Since the cooling system rapidly cools the heated module IC, the number of module ICs that fail can be reduced, thus resulting in an improvement in the reliability of the products.

15 Claims, 9 Drawing Sheets

COOLING SYSTEM FOR A MODULE IC HANDLER

BACKGROUND OF THE INVENTION

1. Field of the Invention

The present invention relates to a cooling system used for a module IC handler, and more particularly to a cooling system for a module IC handler having an air jet for cooling heat generated from a module IC when the module IC is tested.

2. Background of the Related Art

An example of a conventional module IC 1, mounted on a main substrate, is shown in FIG. 1 and typically comprises: a substrate having side surfaces; and independent plural ICs and electric components 2 soldered on either one side or both sides of the substrate, so that a capacity of the module IC is extended. Reference numeral 1a in FIG. 1 denotes a contact portion.

Such a module IC provides higher added-value when sold, as compared with the individual sale of each IC produced. To this end, IC manufactures tend to develop module ICs as a main product sold as a unit. However, the module IC available from the market as a product is relatively expensive and thus higher reliability testing is an important factor. This requires strict quality testing for passing only products determined to be good, and otherwise, discarding all the module ICs that fail.

In the prior art, there has been no apparatus for automatically loading module ICs as final products into a test socket, testing the same, classifying the module ICs into respective categories depending upon the test results and then unloading the classified modules into customer trays (not shown).

To test the final module IC product, the operator manually has to pick up one module IC from the test tray in which the module ICs are loaded, load it into a test socket, conduct the tests for a preset time period, and classify the module IC depending upon the test results in order to put it in the customer tray. This results in lower productivity due to the manual work.

Previously module ICs passed and supplied to the market were tested only under a normal temperature. However, because the module IC is actually driven at a higher temperature in appliances, there occurs a difference between conditions during testing and those under actual use of the IC, thus resulting in lower reliability of the product.

Further, the prior art needs a long time to cool heat generated from the module IC itself and from the test environment during testing of the module IC, thus resulting in lower product yield.

SUMMARY OF THE INVENTION

Therefore, it is an object of the present invention to provide a cooling system for a module IC handler capable of rapidly cooling the module ICs using air jets during testing of the module ICs.

According to one aspect of the present invention, there is provided a cooling system for a module IC (integrated circuit) handler comprising: a base plate; an air jet body mounted on the base plate and having one or more coupling portions; a plurality of plates provided at one side of the air jet body; and a cover provided at the other side of the air jet body.

DETAILED DESCRIPTION OF PREFERRED EMBODIMENTS

A cooling system for a module IC handler will be described below, with reference to the accompanying drawings.

Figure 1:
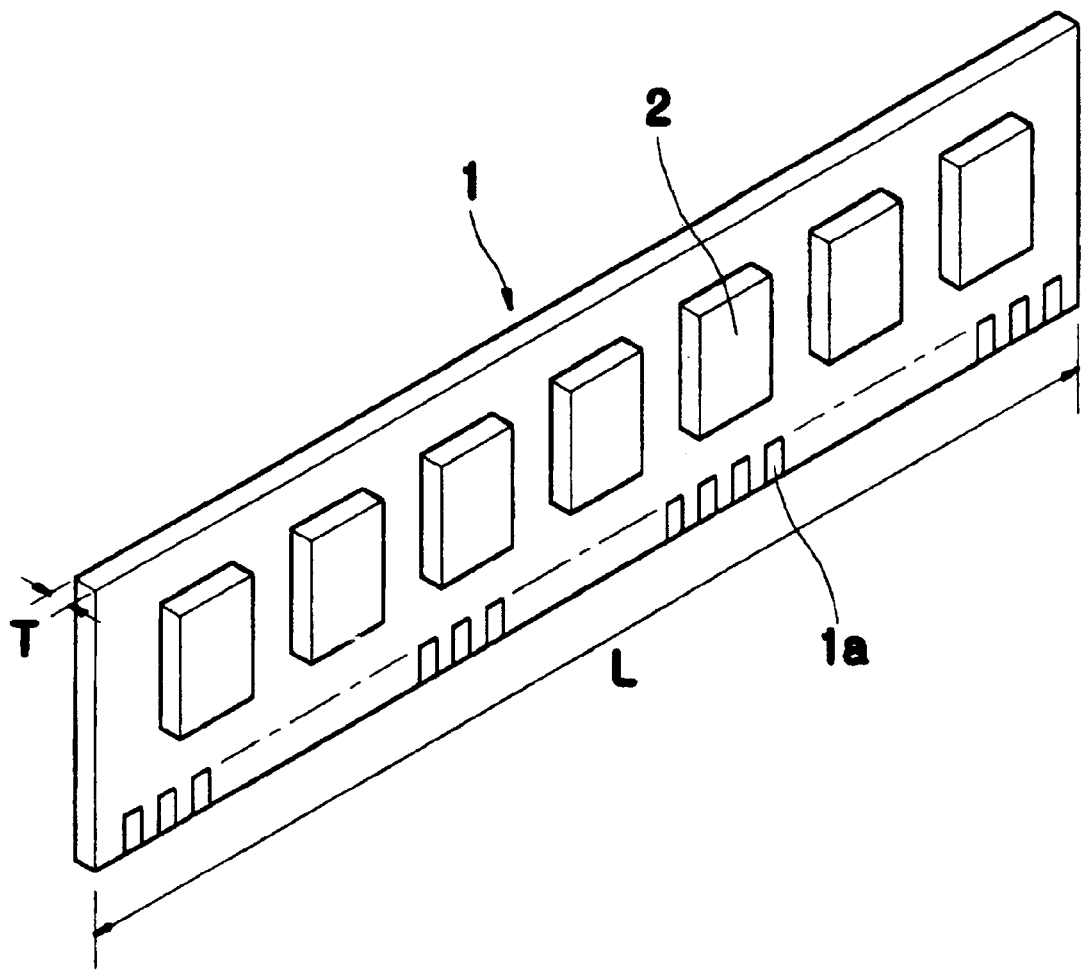
FIG. 1 is a perspective view showing a conventional module IC.
Figure 2:
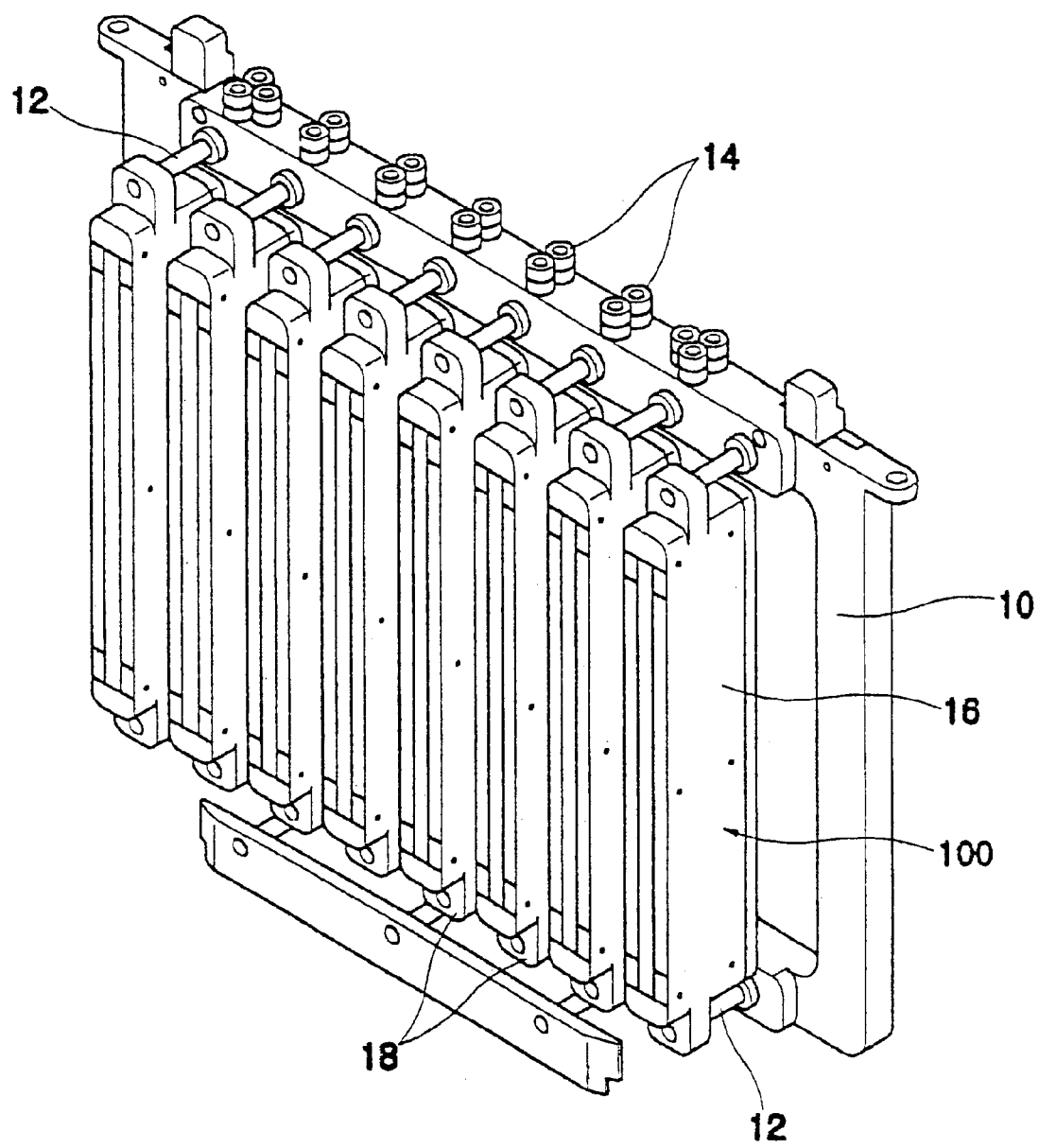
FIG. 2 is a perspective view showing a structure of an-air jet assembly for a module IC handler according to the present invention.
Figure 3:
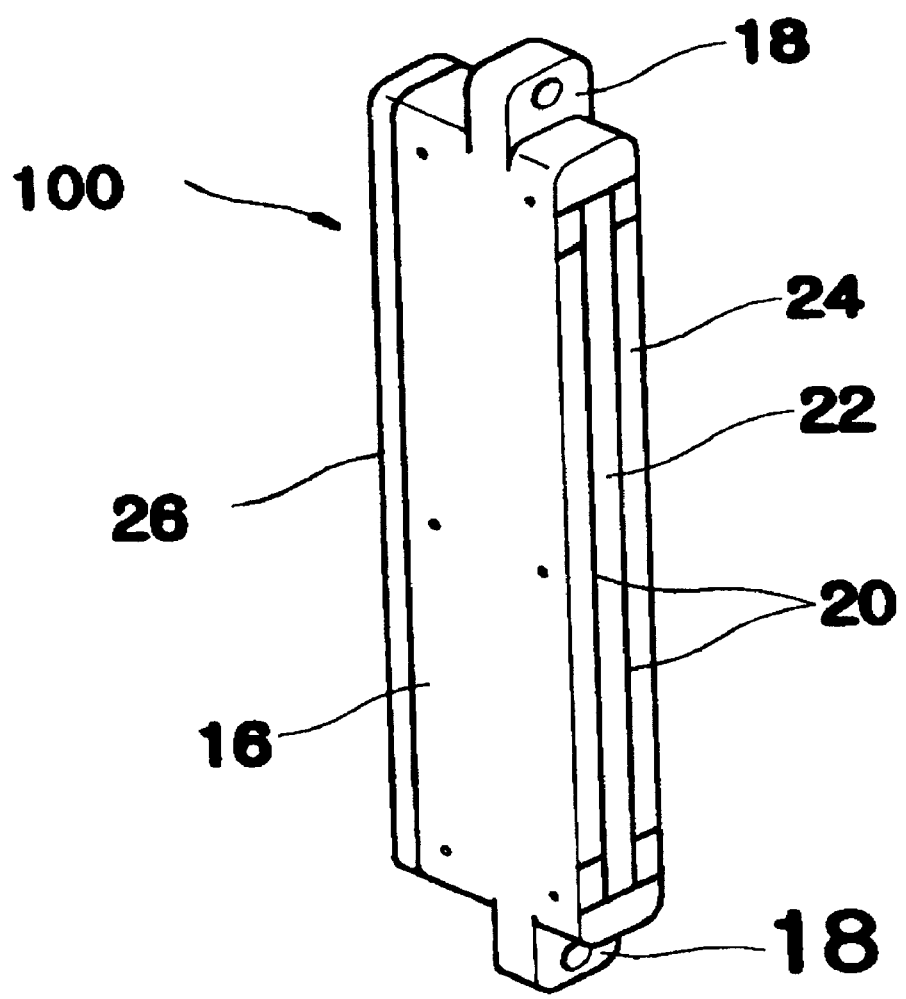
FIG. 3 is a perspective view showing an air jet for the module IC handler according to the present invention.
Figure 4:
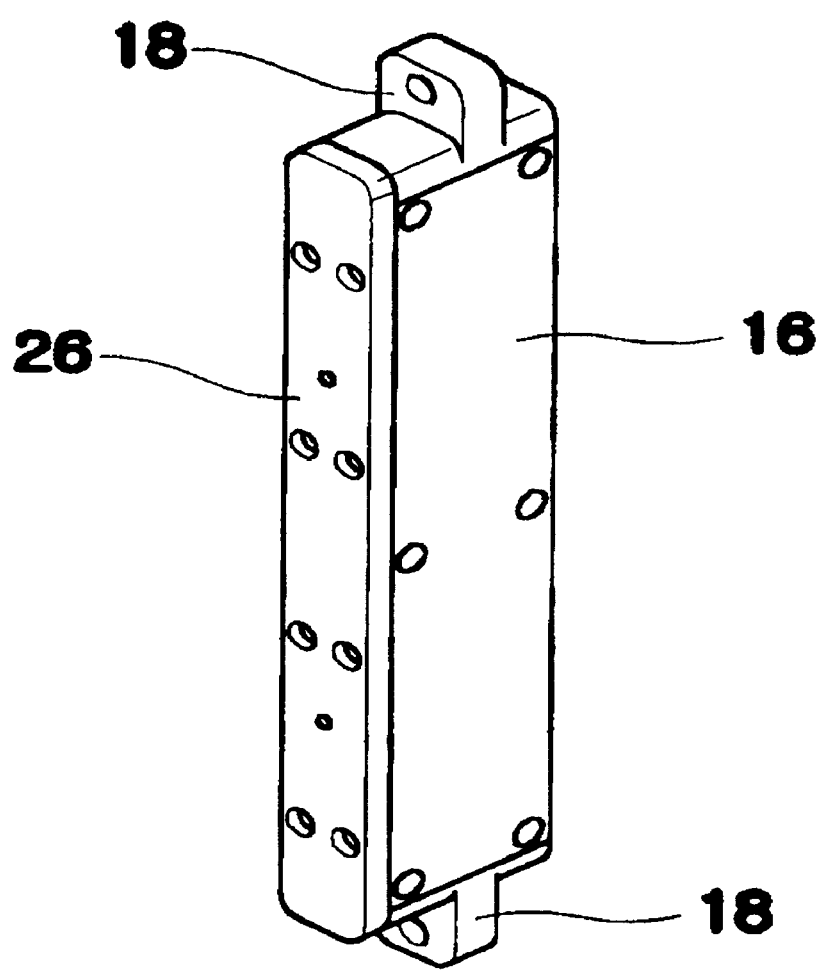
FIG. 4 is a perspective view showing a bottom portion of the air jet of the present invention.
Figure 5:
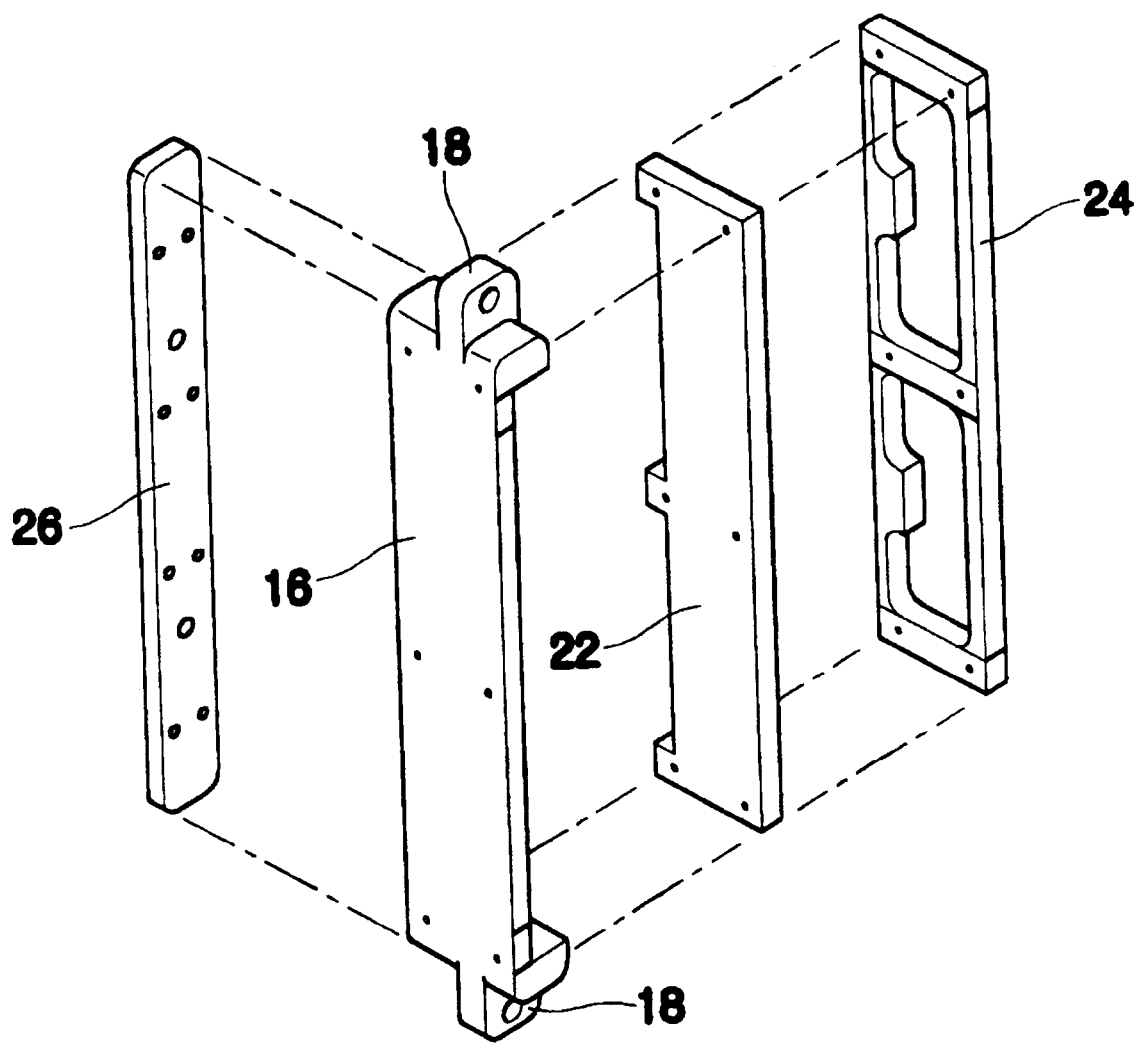
FIG. 5 is an exploded perspective view showing the air jet of the present invention.

FIG. 2 is a perspective view showing a structure of an air jet assembly for a module IC handler according to the present invention. FIG. 3 is a perspective view showing an air jet for the module IC handler according to the present invention. FIG. 4 is a perspective view showing a bottom portion of the air jet of the present invention. FIG. 5 is an exploded perspective view showing the air jet of the present invention.

A cooling system according to the present invention includes a base plate 10 having one side on which air supplying pipes 14 are provided and air jets 100 fixed by means of pins 12 at a lower portion of the base plate 10. Each of the air jets 100 includes an air jet body 16 having coupling portions 18 fixedly coupled by the pins 12, a first plate 22 coupled to one side of the air jet body 16, a second plate 24 provided parallel to the first plate 22 and integral with the air jet body 16, and a cover 26. The installation of the first plate 22 is such that air gap 20 is formed between the first and second plates 22 and 24 and between first plate 22 and the air jet body 16.

A plurality of air supplying pipes 14 for supplying air into one side of the base plate 10 are provided. The pins 12 are vertically fixed downward on the bottom surface of the base plate 10.

The air jet 100 includes the air jet body 16, having coupling portions 18 formed on both sides thereof, and the first plate 22 and the second plate 24, which are sequentially formed adjacent to one side surface of the body 16. Between the first plate 22 and the second plate 24 and between the first plate 22 and the air jet body 16, the slit-like air gaps 20 are longitudinally formed such that air supplied through the air supplying pipes 14 flows through the gaps.

A top surface which is formed when the first and second plates 22 and 24 are assembled to the air jet body 16 is covered with a cover 26 which is firmly fixed thereto.

The plurality of air jets 100 are arranged in a line on the lower portion of the base plate 10. Each of the air jets 100 has a coupling portion 18 fixed at the base plate 10 using the plural pins 12.

Figure 6:
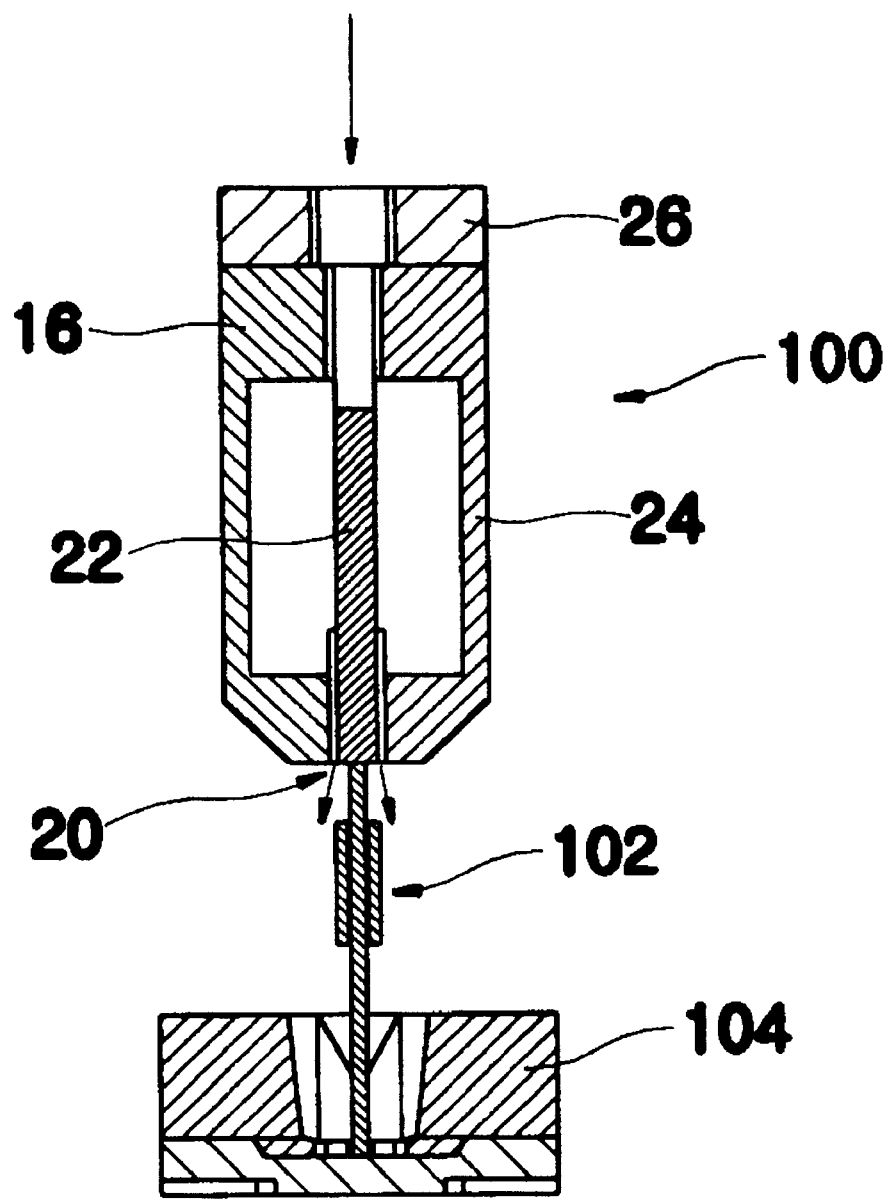
FIG. 6 is a sectional view of the air jet in accordance with one embodiment of the present invention.
Figure 7:
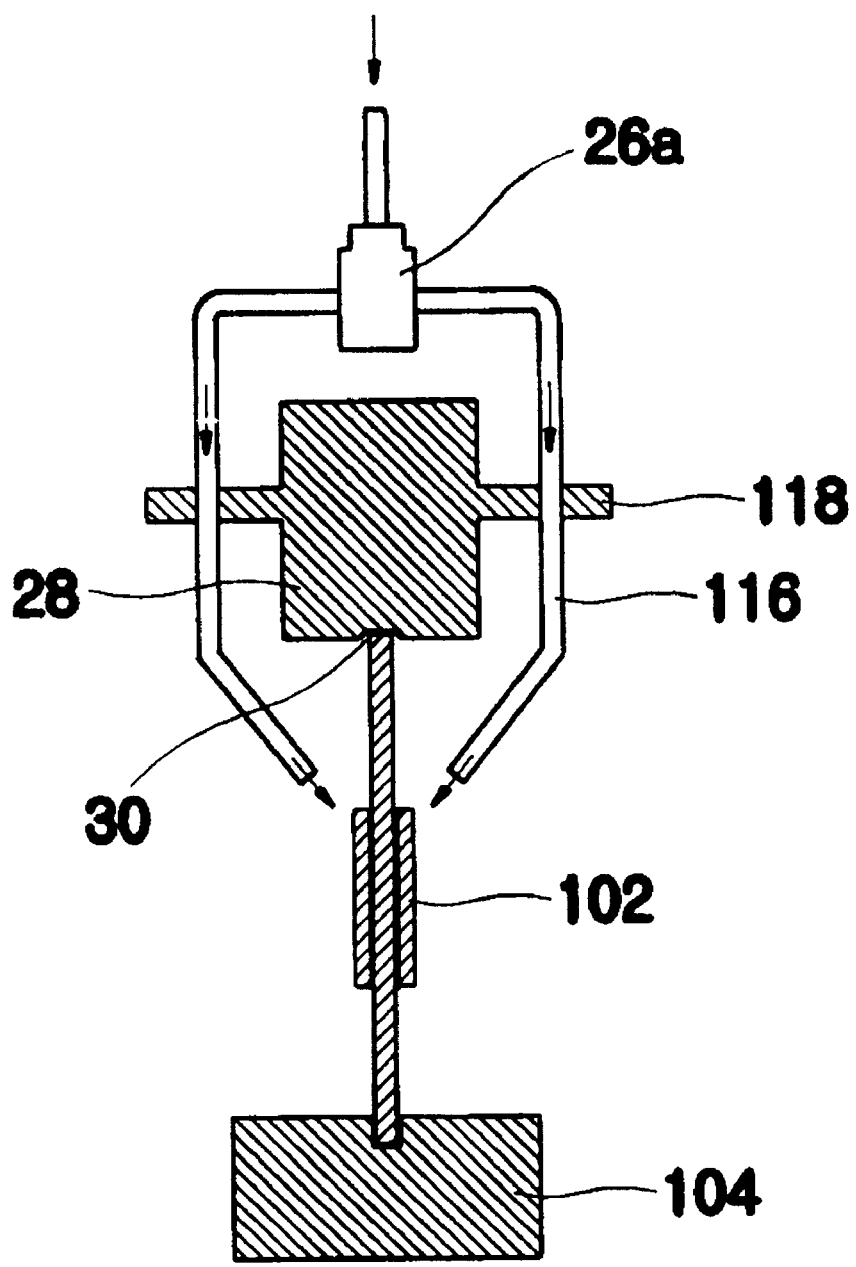
FIG. 7 is a sectional view showing another embodiment of the present invention.

FIG. 6 is a sectional view of the air jet in accordance with one embodiment of the present invention. FIG. 7 is a sectional view showing another embodiment of the present invention.

According to one embodiment of the present invention, the air jet 100 includes a cover 26 having a screw hole to which a valve (not shown) is coupled, and a first plate 22 and a second plate 24 provided parallel thereto. These elements are integrally formed to produce the air jet 100. The air jet body 16 and the first and second plates 22, 24 are installed to yield gaps 20 therebetween through which air is introduced.

The module IC 102 generates high temperature heat in the course of being subjected to testing, the IC having been moved by a picking means (not shown) and seated in the test socket 104. Since it is difficult to immediately transfer a high temperature module IC, the IC module needs to be cooled using the air jet 100, as shown in FIG. 6, provided by the present invention.

As shown in FIG. 6, the air jet 100 is operated to jet air which is introduced through the air supplying pipe 14, towards the upper portion of the module IC 102 to cool the module IC 102. In this case, air flows in a direction shown by the arrow in FIG. 6, and is discharged outside the air jet 100.

FIG. 7 shows another embodiment of the present invention, and is a sectional view showing a pin-type air jet 100. As shown in FIG. 7, an air supplying pipe 116 through which air passes is configured to branch into two air passage pipes at a branch point comprising a coupling portion 26a. A fixing plate 28 having fixing portions 118 is provided so that the branched air passage pipes can be longitudinally extended in both directions. Since the fixing plate 28 is fixed by means of the fixing portions, the air supplying pipe 116 remains stationary.

The fixing plate 28 has at a lower end thereof a groove 30 for receiving the upper portion of the module IC 102 so as to accurately position the module IC 102. The module IC 102 is inserted into the test socket 104 to be subjected to testing. The position of the upper portion of the module IC 102 is determined by the groove 30. Air is discharged through the air supplying pipe 116 to cool the module IC which is being tested.

Figure 8:
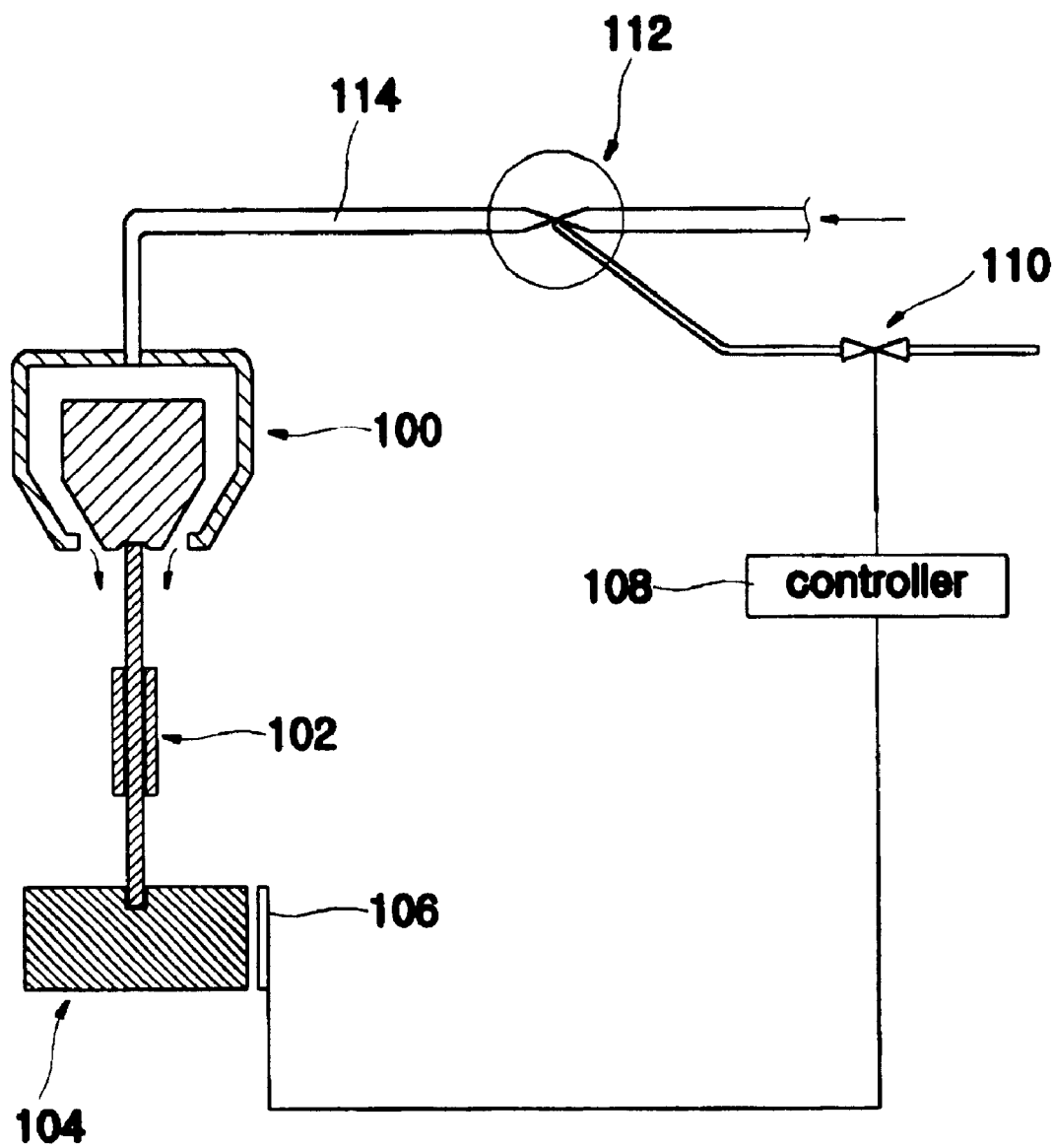
FIG. 8 shows a heat generation suppression system employing the air jet shown in FIG. 6.
Figure 9:
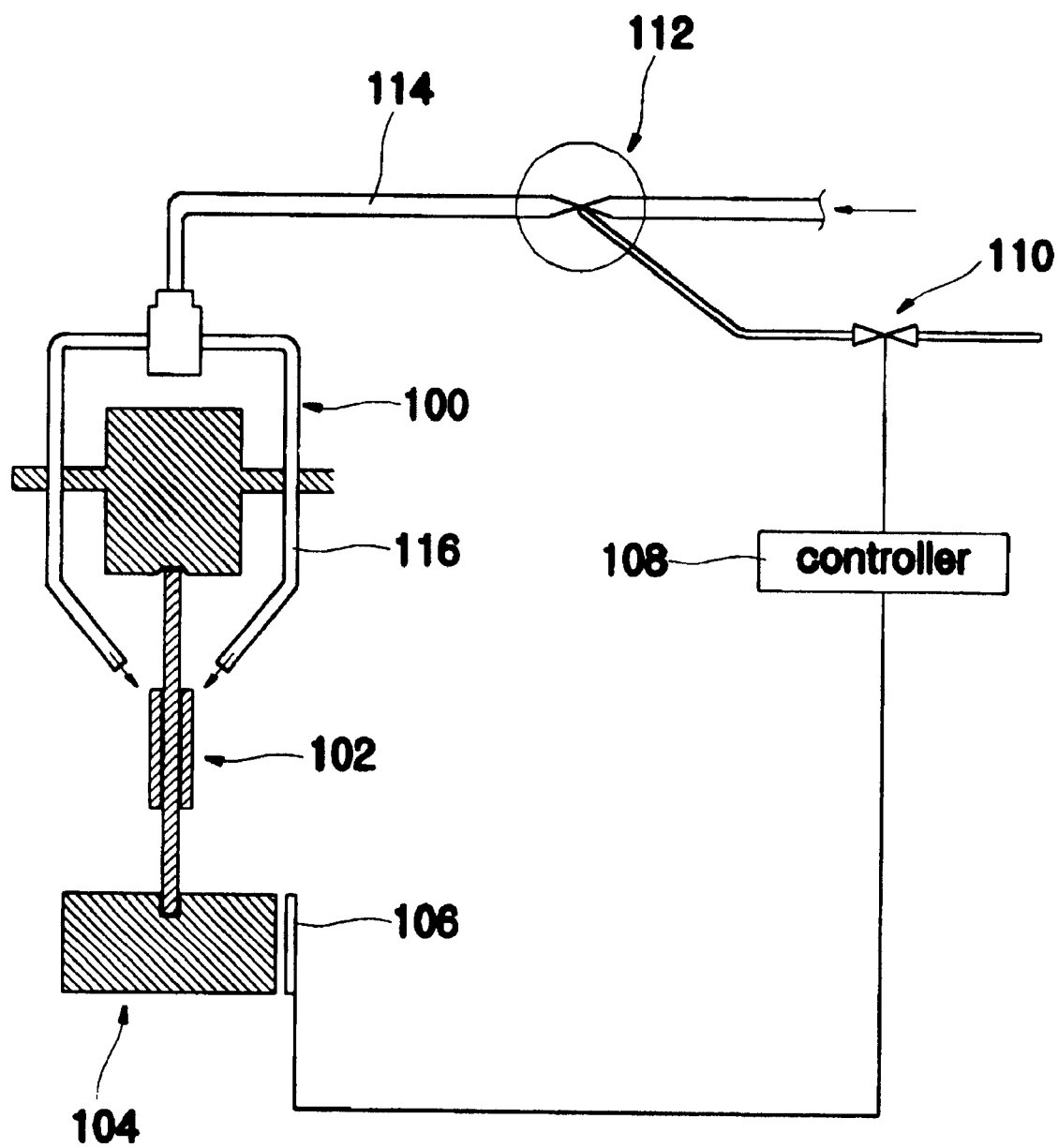
FIG. 9 show an embodiment of a heat generation suppression system when the air jet as shown in FIG. 7 is employed.

FIG. 8 shows a heat generation suppression system employing the air jet 100 shown in FIG. 6. FIG. 9 shows an embodiment of a heat generation suppression system when the air jet as shown in FIG. 8 is employed.

As already mentioned in FIGS. 6 and 7, the test of the module IC is conducted when the module IC is inserted into the test socket 104 It is noted that, as shown in FIGS. 8 and 9, the test socket 104 has one side on which a sensor 106 electrically connected to a controller 108 is provided.

The cover 26, which covers the top portion of the air jet 100, is coupled to the air supplying pipe 114. A vaporizer 112 is installed at a halfway point of the air supplying pipe 14. The vaporizer 112 is connected to a valve 110, which may be a solenoid valve, through which a refrigerant, in this embodiment liquid nitrogen ($LN_2$) gas, is fed.

In operation of such a cooling system with the heat generation suppression system, the sensor 106 senses heat generated from the module IC 102 being tested, and sends the sensed signal to the controller 108. The controller 108 receives the signal from the sensor 106, and controls the opening or closing of the solenoid valve 110 so as to feed an appropriate amount of the $LN_2$ gas.

The $LN_2$ gas is mixed with compressed air in the vaporizer 112. The mixed gas is then supplied into the air jet 100 through the air supplying pipes 114, 116. Air jetted from the air jet 100 cools the heated module IC 102 located below the air jet 100.

In such a manner, when the module IC 102 is heated during testing, the sensor is utilized to adjust an amount of the refrigerant so that a temperature rise of the module IC 102 can be suppressed.

Therefore, according to the present invention, the temperature rise of a module IC being tested can be suppressed by utilizing the heat generation suppression system to appropriately adjust a refrigerant amount depending upon the degree of the temperature rise of the module IC during testing. Since the present invention provides a rapid cooling operation of the heated module IC, the number of module IC that fail can be reduced, thus resulting in improvement in the reliability of the products.

What is claimed is:

1. A cooling system for cooling an electronic component, comprising:
   an air jet body;
   a first plate positioned adjacent to the air jet body so as to form a first air gap therebetween through which air is supplied to cool an electronic component; and
   a cover disposed on a side of the air jet body and first plate opposite to a side on which the first air gap is formed, the cover including at least one opening through which air is supplied to the first air gap.

2. The cooling system of claim 1, further comprising:
   a source of air in communication with the at least one opening.

3. The cooling system of claim 1, further comprising:
   an air supply pipe in communication with the at least one opening, wherein the air supply pipe is in communication with a source of air.

4. The cooling system of claim 3, further comprising:
   a vaporizer connected to the air supply pipe;
   a refrigerant supply line coupled to the vaporizer and to a source of refrigerant;
   a solenoid valve connected to the refrigerant supply line and configured to control a flow of refrigerant through the refrigerant supply line; and
   a controller for controlling the solenoid valve.

5. The cooling system of claim 4, further comprising a sensor disposed adjacent to a test socket in which an electronic component is disposed for testing, wherein the sensor is configured to sense a change in temperature of the electronic component and to provide a temperature signal to the controller.

6. The cooling system of claim 1, further comprising:
   a base plate to which the air jet is connected.

7. The cooling system of claim 6, wherein the air jet is connected to the base plate via coupling portions provided on the air jet body.

8. The cooling system of claim 1, wherein the air jet body and the first plate extend substantially parallel to one another.

9. The cooling system of claim 8, further comprising a second plate disposed adjacent to the first plate so as to form a second air gap therebetween, through which air is supplied to cool an electronic component, wherein the first plate and second plate extend substantially parallel to one another.

10. The cooling system of claim 9, wherein the first plate includes a groove for receiving therein an end of an electronic component such that air expelled through the first air gap flows along one side of the electronic component and air expelled through the second air gap flows along another side of the electronic component.

11. An air jet for cooling an electronic component, comprising:

an air jet body;

a first plate positioned adjacent to the air jet body so as to form a gap therebetween through which air is supplied to cool an electronic component;

a second plate disposed adjacent to the first plate so as to form a gap therebetween through which air is supplied to cool an electronic component; and a cover disposed on a side of the air jet body, the first plate and the second plate, opposite to a side on which the air gaps are formed, the cover including an opening through which air is supplied.

12. The air jet of claim 11, wherein the air jet body, the first plate and the second plate all extend substantially-parallel to one another.

13. A cooling system for an electronic component, comprising:

an air supply pipe branched to form at least two branch air supply pipes; and a fixing plate configured to support each of said at least two branch air supply pipes and having a groove disposed therein configured to receive an electronic component such that air expelled from one of said branch air supply pipes flows along one side of the electronic component and air expelled from another of said branch air supply pipes flows along another side of said electronic component.

14. The cooling system of claim 13, further comprising:

a vaporizer connected to the air supply pipe;

a refrigerant supply line coupled to the vaporizer;

a solenoid valve connected to the refrigerant supply line and configured to control a flow of refrigerant through the refrigerant supply line; and a controller for controlling the solenoid valve.

15. The cooling system of claim 14, further comprising a sensor disposed adjacent to a test socket in which an electronic component is disposed for testing, wherein the sensor is configured to sense a change in temperature of the electronic component and to send a temperature signal to the controller.

* * * * *